(12) United States Patent
Mebarki et al.

(10) Patent No.: US 10,930,472 B2
(45) Date of Patent: Feb. 23, 2021

(54) METHODS FOR FORMING A METAL SILICIDE INTERCONNECTION NANOWIRE STRUCTURE

(71) Applicant: Applied Materials, Inc., Santa Clara, CA (US)

(72) Inventors: Bencherki Mebarki, Santa Clara, CA (US); Annamalai Lakshmanan, Fremont, CA (US); Kaushal K. Singh, Santa Clara, CA (US); Andrew Cockburn, Brussels (BE); Ludovic Godet, Sunnyvale, CA (US); Paul F. Ma, Santa Clara, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 108 days.

(21) Appl. No.: 16/250,763

(22) Filed: Jan. 17, 2019

(65) Prior Publication Data

US 2019/0172686 A1 Jun. 6, 2019

Related U.S. Application Data

(62) Division of application No. 14/525,555, filed on Oct. 28, 2014, now Pat. No. 10,204,764.

(51) Int. Cl.
*H01J 37/32* (2006.01)
*C23C 16/42* (2006.01)
(Continued)

(52) U.S. Cl.
CPC ........ *H01J 37/32192* (2013.01); *C23C 16/42* (2013.01); *C23C 16/56* (2013.01);
(Continued)

(58) Field of Classification Search
CPC .... C23C 16/42; C23C 16/56; H01J 37/32091; H01J 37/32321; H01J 37/32339;
(Continued)

(56) References Cited

U.S. PATENT DOCUMENTS 6,026,762 A 2/2000 Kao et al.
10,204,764 B2* 2/2019 Mebarki ............. H01J 7/32091
(Continued)

FOREIGN PATENT DOCUMENTS

| TW | 200710963 A | 3/2007 |
| TW | 201337028 A | 9/2013 |
| TW | 201349391 A | 12/2013 |

OTHER PUBLICATIONS

Office Action for Taiwan Patent Application No. 104133892 dated Mar. 20, 2019.
(Continued)

*Primary Examiner* — Seahvosh Nikmanesh
(74) *Attorney, Agent, or Firm* — Patterson + Sheridan, LLP

(57) ABSTRACT

Methods and apparatus for forming a metal silicide as nanowires for back-end interconnection structures for semiconductor applications are provided. In one embodiment, the method includes forming a metal silicide layer on a substrate by a chemical vapor deposition process or a physical vapor deposition process, thermal treating the metal silicide layer in a processing chamber, applying a microwave power in the processing chamber while thermal treating the metal silicide layer; and maintaining a substrate temperature less than 400 degrees Celsius while thermal treating the metal silicide layer. In another embodiment, a method includes supplying a deposition gas mixture including at least a metal containing precursor and a reacting gas on a surface of a substrate, forming a plasma in the presence of the deposition gas mixture by exposure to microwave power, exposing the
(Continued)

plasma to light radiation, and forming a metal silicide layer on the substrate from the deposition gas.

9 Claims, 5 Drawing Sheets

(51) Int. Cl.
    *C23C 16/56*     (2006.01)
    *H01L 21/285*     (2006.01)
    *H01L 21/768*     (2006.01)
    *H01L 21/3205*     (2006.01)
    *H01L 21/268*     (2006.01)

(52) U.S. Cl.
    CPC .. *H01J 37/32091* (2013.01); *H01J 37/32321* (2013.01); *H01J 37/32339* (2013.01); *H01L 21/2686* (2013.01); *H01L 21/28556* (2013.01); *H01L 21/32053* (2013.01); *H01L 21/76885* (2013.01)

(58) Field of Classification Search
    CPC ............. H01L 21/286; H01L 21/28556; H01L 21/32053; H01L 21/76885
    See application file for complete search history.

(56) References Cited

U.S. PATENT DOCUMENTS

| | | |
|---|---|---|
| 2002/0158337 A1 | 10/2002 | Babich et al. |
| 2006/0234519 A1 | 10/2006 | Pan et al. |
| 2007/0287237 A1 | 12/2007 | Rockenberger et al. |
| 2008/0315430 A1 | 12/2008 | Weber et al. |
| 2009/0269941 A1 | 10/2009 | Raisanen et al. |
| 2011/0061810 A1* | 3/2011 | Ganguly ........... H01L 21/67207 156/345.27 |
| 2011/0104897 A1 | 5/2011 | Lu et al. |
| 2012/0153480 A1 | 6/2012 | Pfuetzner et al. |
| 2013/0175073 A1 | 7/2013 | Cooney, III et al. |
| 2014/0068962 A1 | 3/2014 | Mori et al. |
| 2014/0306271 A1 | 10/2014 | Wu et al. |
| 2015/0021746 A1 | 1/2015 | Theodore |
| 2015/0270222 A1 | 9/2015 | Alptekin et al. |
| 2015/0380526 A1 | 12/2015 | Godet et al. |

OTHER PUBLICATIONS

International Search Report for PCT/US2015/050845 dated Dec. 23, 2015 (13 pgs.).

Peter, et al., Phase Formation and Morphology of Nickel Silicide Thin Films Synthesized by Catalyzed Chemical Vapor Reaction of Nickel with Saline, Dec. 15, 2014, ACS, pp. 245-254.

Sung et al., Remote-plasma chemical vapor deposition of conformal ZrB2 films at low temperature: A promising diffusion barrier for ultralarge scale integrated electronics, Mar. 15, 2002, Journal of Applied Physics, vol. 91, No. 6, pp. 3904-3911.

\* cited by examiner

METHODS FOR FORMING A METAL SILICIDE INTERCONNECTION NANOWIRE STRUCTURE

CROSS-REFERENCE TO OTHER APPLICATIONS

This application is a divisional application of U.S. patent application Ser. No. 14/525,555, filed Oct. 28, 2014, which is herein incorporated by reference in its entirety.

BACKGROUND OF THE INVENTION

Field of the Invention

Embodiments of the present invention generally relate to methods for forming semiconductor devices. More particularly, embodiments of the present invention generally relate to methods for forming an interconnection structure using nickel silicide for semiconductor applications.

Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. As the feature widths decrease, the device current typically remains constant or increases, which results in an increased current density for such features. Higher device densities, faster operating frequencies, and larger die sizes have created a need for a metal with lower resistivity than traditional aluminum to be used in interconnect structures. Copper materials with lower resistivity have been used for decades for its high conductivity. However, as discussed, small size effect may also result in increased resistivity of copper as line widths shrink below around 50 nm and approach the mean free path of electrons in copper (39 nm). The resistivity increase is caused by electron scattering at the surface of the line and at grain boundaries.

Conventional copper wire may also cause electromigration when current density exceeds certain level. Electromigration defects threaten the reliability of nanometer-size copper interconnects. Electromigration causes internal and external cavities that lead to wire failure. For example, electromigration may lead to increased electrical resistance or even an open circuit if a sufficiently large void forms within the copper interconnection.

In order to overcome these drawbacks for next generation small dimension technologies, many new materials, such as carbon nanotubes and the like, have been researched for the possibilities to replace copper with better electrical conductive properties, lower electrical resistance as well as higher device speed. However, there remain several challenges in integrating new materials into an interconnection structure with desired electrical properties, high mechanical strength and integration capability.

Therefore, there is a need for a suitable material for metal interconnection for semiconductor interconnection manufacturing process.

SUMMARY OF THE INVENTION

Methods and apparatus for forming a metal silicide material as nanowires for nano-scale back-end interconnection structures for semiconductor applications are provided. In one embodiment, a method for forming nanowires in back-end interconnection structure for semiconductor devices includes forming a metal silicide layer on a substrate by a chemical vapor deposition process or a physical vapor deposition process, thermal treating the metal silicide layer in a processing chamber, applying a microwave power in the processing chamber while thermal treating the metal silicide layer; and maintaining a substrate temperature less than 400 degrees Celsius while thermal treating the metal silicide layer.

In another embodiment, a method for forming nanowires in back-end interconnection structure for semiconductor devices includes at least a metal containing precursor and a reacting gas on a surface of a substrate, forming a plasma in the presence of the deposition gas mixture by exposure to microwave power, exposing the plasma to light radiation, and forming a metal silicide layer on the substrate from the deposition gas.

In yet another embodiment, an apparatus for forming metal silicide nanowires for back-end interconnection structure for semiconductor devices includes a chamber body having a chamber lid disposed on a chamber sidewall defining an interior volume of a plasma processing chamber, a gas panel configured to provide nickel containing compound into the interior volume of the plasma processing chamber, a substrate support pedestal disposed in the interior volume of the plasma processing chamber, a microwave generator coupled to the chamber body, and a light configured to expose a substrate disposed on the substrate support pedestal to a light having a wavelength between about 1 mm and about 1000 mm.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present disclosure describe methods and apparatus for forming a metal silicide layer that may be utilized as conductive nanowires in back-end interconnect structures for semiconductor device manufacturing. In one example, the metal silicide layer is formed by a deposition process under a temperature less than 400 degrees Celsius. Suitable deposition techniques may be utilized to form the metal silicide layer include plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD) and the like, or any suitable deposition techniques. In one particular example, the metal silicide layer may be formed by a chemical vapor deposition with IR light and microwave enhanced plasma.

Figure 1A:
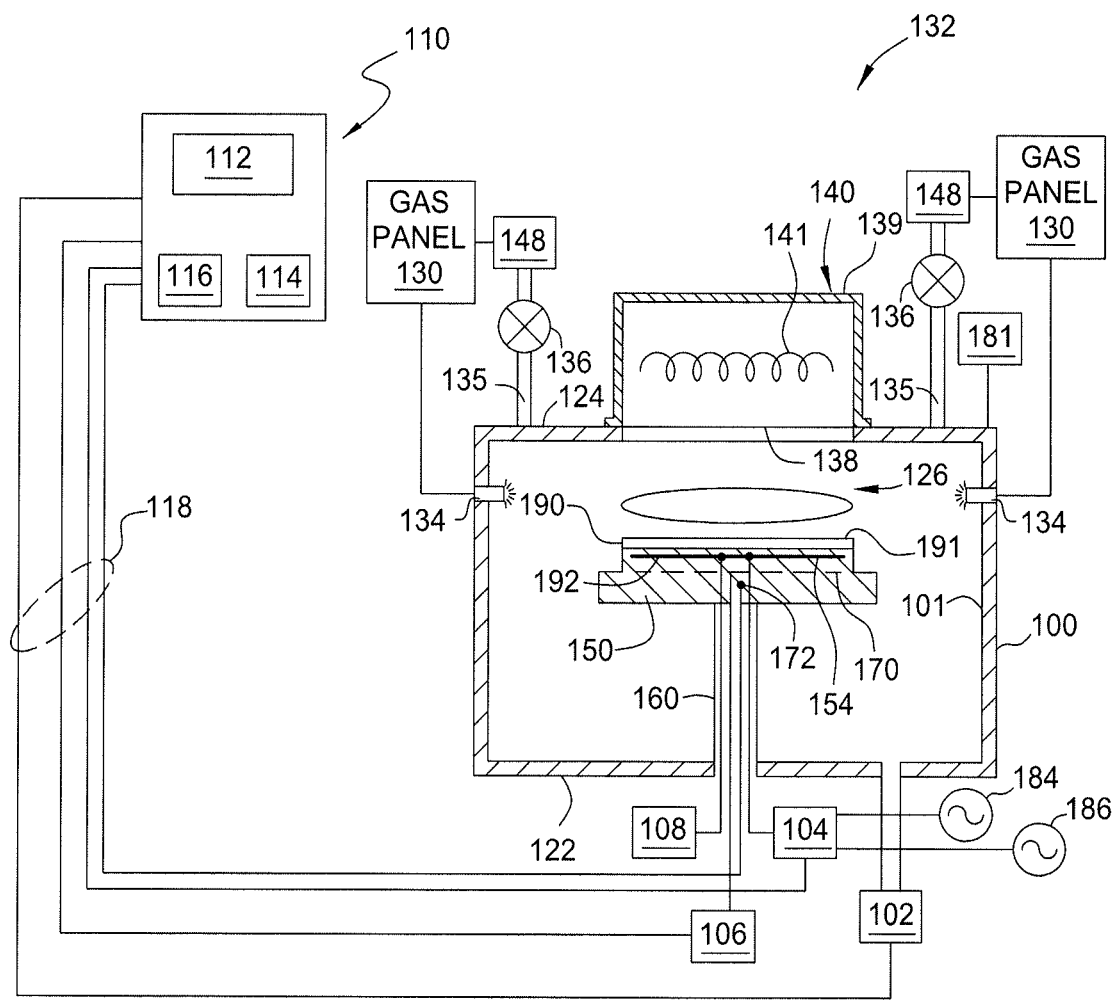
FIG. 1A is a cross section view of a plasma processing chamber adapted to perform a chemical vapor deposition process.

FIG. 1A is a cross sectional view of a plasma processing system 132 suitable for forming a metal silicide layer that may be utilized as conductive nanowires in back-end interconnection structures for semiconductor devices manufacture. The processing system 132 may be a suitably adapted CENTURA®, Producer® SE or Producer® GT processing system available from Applied Materials, Inc., of Santa Clara, Calif. It is contemplated that other processing systems, including those produced by other manufacturers, may benefit from embodiments described herein.

The processing system 132 includes a process chamber 100 coupled to a controller 110. The process chamber 100 generally includes a ceiling 124, a side 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 450 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power sources 184, 186. Although the example depicted in FIG. 1A shows two RF bias power sources, 184, 186, it is noted that the numbers of the RF bias power sources may be any number as needed. The RF bias power sources 184, 186 are coupled between the electrode 192 disposed in the pedestal 150 and another electrode, such as a showerhead assembly 142 (depicted in FIG. 4B) or ceiling (lid 124) of the processing chamber 100. The RF bias power source 184, 186 excites and sustains a plasma discharge formed from the gases disposed in the processing region of the processing chamber 100.

In the embodiment depicted in FIG. 1A, the dual RF bias power sources 184, 186 are coupled to the electrode 192 disposed in the pedestal 150 through a matching circuit 104. The signal generated by the RF bias power 184, 186 is delivered through matching circuit 104 to the pedestal 150 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber 100. The vacuum pump 102 is used to maintain a desired gas pressure in the process chamber 100. The vacuum pump 102 also evacuates post-processing gases and by-products of the process from the chamber 100.

A light source 140 is disposed on the processing chamber 100 partially defining the lid 124 of the processing chamber 100. The light source 140 is configured to provide heat energy to the substrate 190 disposed on the substrate pedestal 150 through a window 138. The window 138 is typically made from quartz disposed in the lid 124 of the processing chamber 100 and is at least partially covered by the light source 140.

The light source 140 may comprise various types of radiant heaters. In one example, the light source 140 includes a housing 139 having one or more light sources 141 disposed therein. A power connection (not shown) may be coupled to the light source 140 to facilitate providing power to the light sources 141. In one example, the one or more light sources 141 disposed in the light source 140 may provide radiant energy, such as an IR radiation and/or longer wavelength of UV radiation having a wavelength between about 400 nm and about 4000 nm, to the substrate 190. In one embodiment, radiant energy provided from light sources 141 is believed to enhance photons generated from the plasma to be emitted to the substrate 190 to facilitate chemical reaction during processing. The light sources 141 provide IR and/or UV light, e.g., photons, in the plasma, thus enhancing distribution of photons across the substrate surface 191.

The processing chamber 100 includes one or more gas delivery passages 135 coupled through the lid 124 or sidewalls 101 of the processing chamber 100. The gas delivery passages 135 and the vacuum pump 102 are positioned at opposite ends of the processing chamber 100 to induce laminar flow within the interior volume 126 to minimize particulate contamination. In one embodiment, two more gas delivery passages 135 are disposed through the lid 124 of the processing chamber 100. The gas delivery passage 135 typically is coupled to a valve 136 to selectively allow processing gases from the gas panel 130 flowing into and out of the interior volume 126. Alternatively, the additional passages 134 may be positioned at adjacent walls 101 to provide a more uniform gas distribution across a surface 191 of the substrate 190.

The gas delivery passage 135 is coupled to the gas panel 130 through the valve 136 to provide a gas mixture into the interior volume 126. In one embodiment, the gas delivery passages 135 may be configured as a gas distribution ring wherein the gas mixture may be distributed from adjacent the walls 101 through an array of holes to optimize the flow uniformity. In another embodiment, the gas mixture may be supplied to the processing chamber 100 through a gas distribution plate 142 (shown in FIG. 1B) disposed below the light source 140. The gas distribution plate may be fabricated by a material transmissive to the heat generated from the light source 140 such as not to substantially interfere with the heating of the substrates positioned on the substrate pedestal 150. Examples of gases that may be supplied from the gas source 130 may include a metal containing precursors, reacting gases, and carrier gases. Suitable examples of the metal containing precursors include N,N'-di-tert-butylacetamidinato)$_2$Ni, Ni(C$_5$H$_5$)$_2$, Ni[N(t-uut)$_2$], Ni(($^t$Bu$_2$N)$_2$CCH$_3$)$_2$, bis(cyclopentadieny) nickel, bis(ethylpentadieny)nickel, Ni[(C$_2$H$_5$)(C$_5$H$_4$)$_2$], di(tertiarybutyl)amidonickel, and R$_x$O$_y$Ni$_y$(OR')$_z$, or any suitable metal containing precursors, and the like. Suitable examples of the reacting gases includes a silicon containing gas, such as SiH$_4$, Si$_2$H$_6$, SiF$_4$, SiH$_2$Cl$_2$, Si$_4$H$_{10}$, Si$_5$H$_{12}$ and the like. Suitable carrier gas includes nitrogen (N$_2$), argon (Ar), hydrogen (H$_2$), alkanes, alkenes, helium (He), oxygen (O$_2$), ozone (O$_3$), wafer vapor (H$_2$O), and the like.

In one embodiment, a remote plasma source (RPS) 148 may be alternatively coupled to the gas delivery passages 135 to assist in forming a plasma in the interior volume 126. The remote plasma source 148 provides plasma formed from the gas mixture provided by the gas panel 130 to the processing chamber 100.

Furthermore, a microwave generator 181 may be coupled to the lid 124 (or the wall 101) of the processing chamber 100. Similarly, the microwave generator 181 coupled to the processing chamber 100 may assist dissociating of the gases from the gas mixture to become reactive species, so as to enhance the chemical reaction across the substrate surface 191.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the control unit 110 and the various components of the processing system 132 are handled through numerous signal cables collectively referred to as signal buses 118, some of which are illustrated in FIG. 1A.

Figure 1B:
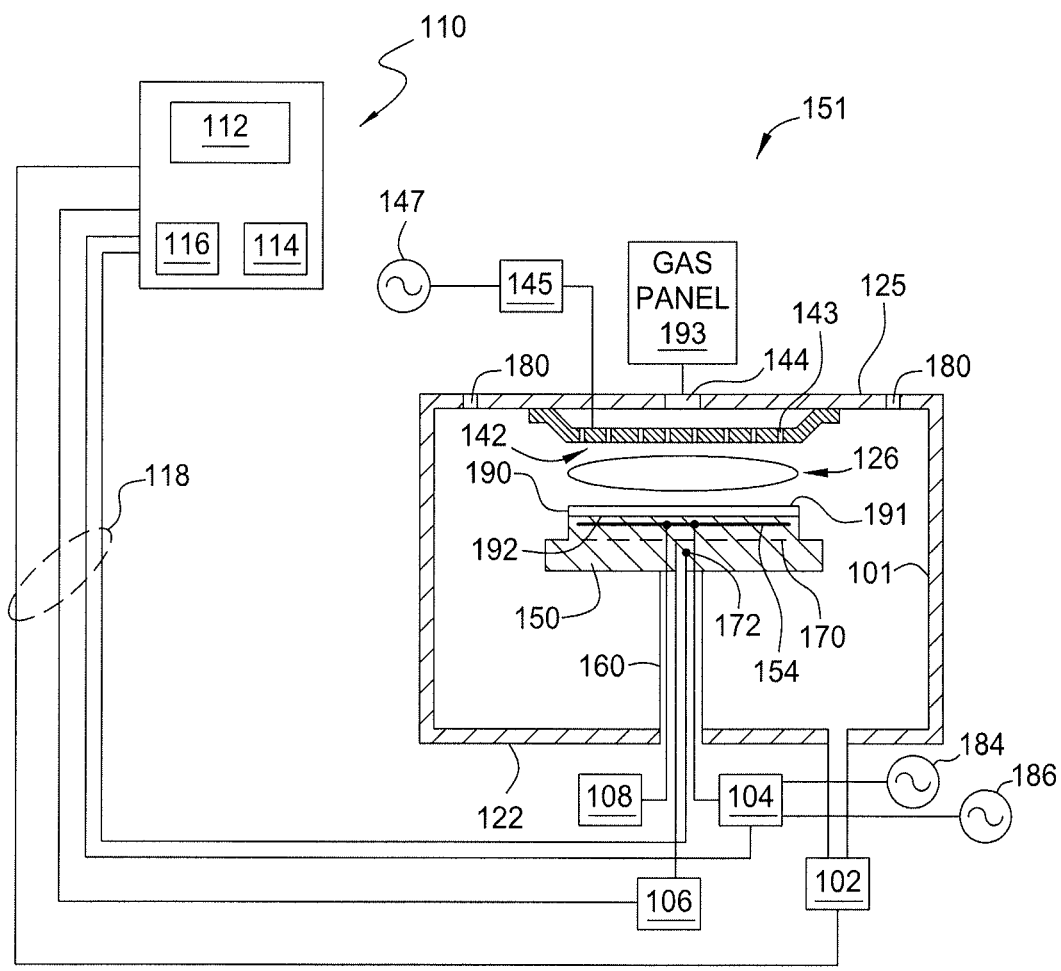
FIG. 1B is a cross section view of another embodiment of a plasma processing chamber adapted to perform a chemical vapor deposition process.

FIG. 1B depicts another embodiment of a plasma processing chamber 151 that may be utilized to form a metal silicide layer. The configuration of the plasma processing chamber 151 depicted in FIG. 1B is similar to the configuration of the processing chamber 100 depicted in FIG. 1A, but with the showerhead 142 coupled to a ceiling 125 of the processing chamber 151. Unlike the light source 140 of FIG. 1A is disposed above the ceiling 124 of the processing chamber 100, the processing chamber 151 depicted in FIG. 1B has a light source 180 formed on an edge of the ceiling 125 while having the gas panel 193 disposed on a center region of the ceiling 125 of the processing chamber 151. The light source 180 may be in form of annular arrays. Similarly, the light source 180 is similar to the light source 141 that may provide radiation that enhances photon generation in the plasma which may assist chemical reaction occurred on the substrate surface 191.

In one example, the showerhead 142 having a plurality of apertures 143 is coupled to the ceiling 125 of the process chamber 100 above the pedestal 150. The apertures 143 of the showerhead 142 are utilized to introduce process gases from the gas panel 193 into the chamber 151. The apertures 143 may have different sizes, number, distributions, shape, design, and diameters to facilitate the flow of the various process gases for different process requirements. A plasma is formed from the process gas mixture exiting the showerhead 142 to enhance thermal decomposition of the process gases resulting in the deposition of material on the surface 191 of the substrate 190.

The showerhead 142 and substrate support pedestal 150 may be formed a pair of spaced apart electrodes in the interior volume 126. One or more RF sources 147 provide a bias potential through a matching network 145 to the showerhead 142 to facilitate generation of a plasma between the showerhead 142 and the pedestal 150. Alternatively, the RF power sources 147 and matching network 145 may be coupled to the showerhead 142, substrate pedestal 150, or coupled to both the showerhead 120 and the substrate pedestal 150, or coupled to an antenna (not shown) disposed exterior to the chamber 150. In one embodiment, the RF sources 140 may provide between about 10 Watts and about 3000 Watts at a frequency of about 30 kHz to about 13.6 MHz. Alternatively, the RF source 147 may be a microwave generator that provide microwave power to the showerhead 142 that assists generation of the plasma in the interior volume 126.

Figure 2:
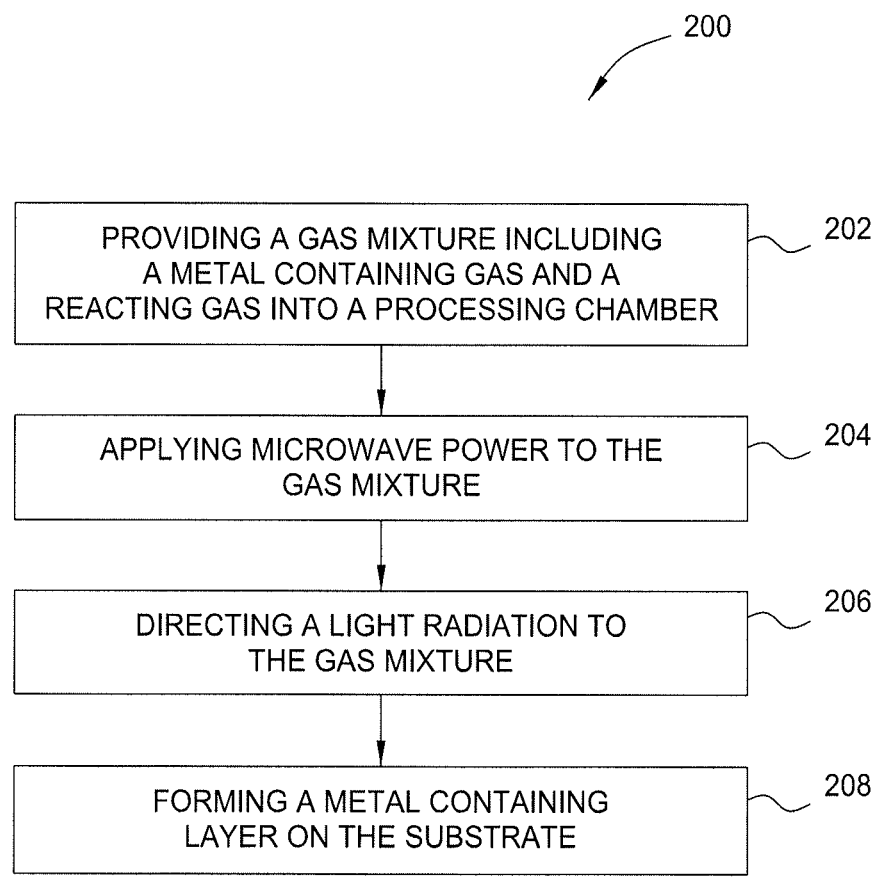
FIG. 2 depicts a flow diagram for forming a metal silicide layer on a substrate utilizing the plasma processing chamber of FIG. 1.
Figure 3A:
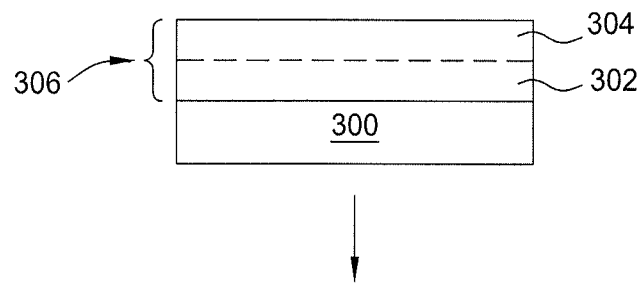
FIGS. 3A-3B depict cross-sectional views of a metal silicide layer formed on a substrate in accordance with the process depicted in FIG. 2.
Figure 3B:
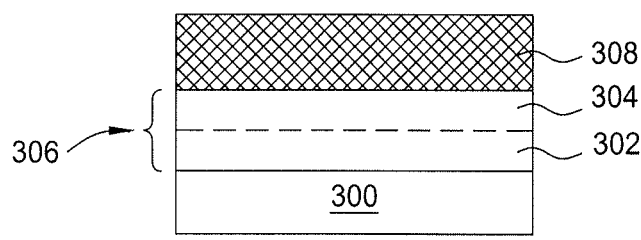

FIG. 2 illustrates a process 200 used to form a metal silicide layer at a low temperature, such as less than 400 degrees Celsius, on a substrate, which may be utilized as conductive nanowires for semiconductor device manufacture. The sequence described in FIG. 2 corresponds to the fabrication stages depicted in FIGS. 3A-3B, which is discussed below. FIGS. 3A-3B illustrate schematic cross-sectional views of a substrate 300 having a film stack 306 disposed thereon that may be utilized to have a metal silicide layer 308 formed thereon using the process 200 described in FIG. 2.

The process sequence 200 starts at operation 202 with a substrate, such as the substrate 300 depicted in FIG. 3A, disposed in into the processing chamber, such as the processing chambers 100 and 150 depicted in FIGS. 1A and 1B, or other suitable processing chamber. The substrate 300 shown in FIG. 3A includes the film stack 306 formed on the substrate 300. The film stack 306 includes a barrier layer 304 disposed on a low-k insulating dielectric material 302. In one example, the substrate 300 may have a substantially planar surface, an uneven surface, or a substantially planar surface having a structure formed thereon. The substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm or 300 mm diameter wafers, as well as, rectangular or square panels. Unless otherwise noted, embodiments and examples described herein are conducted on substrates with a 200 mm diameter, a 300 mm diameter, a 450 mm diameter substrate. In the example wherein a SOI structure is utilized for the substrate 300, the substrate 300 may include a buried dielectric layer disposed on a silicon crystalline substrate. In the embodiment depicted herein, the substrate 301 may be a crystalline silicon substrate.

The barrier layer 304 included in the film stack 306 may be fabricated from TaN, TiN, AlN, TaSiN, TiSiN, or other suitable materials. The low-k insulating dielectric material 302 may have openings (not shown) formed therein configured to have at least one conductive layer disposed therein laterally bounded by the low-k insulating dielectric material 302. The low-k insulating dielectric material 302 may be any suitable silicon oxide containing materials, SiN containing materials, SiOC containing materials, SiC containing materials, carbon based materials, or any other suitable materials. In one example, the low-k insulating dielectric material 302 is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., and other low-k polymers, such as polyamides.

At operation 202, a deposition gas mixture is provided into the processing chamber. The deposition gas mixture includes at least a metal containing precursor and a reacting gas utilized to deposit a metal silicide layer, such as a nickel silicide (NiSi) layer 308, on the substrate 300, as shown in FIG. 3B. The metal containing precursor may be a nickel containing compound. The reacting gas includes at least one silicon containing gas. The nickel silicide (NiSi, $Ni_2Si$, $Ni_3Si_2$) layer 308 as formed herein has high thermal stability, low electrical resistivity and high purity, making the nickel silicide (NiSi, $Ni_2Si$, $Ni_3Si_2$) layer 308 as a good candidate for use in nanowires in back-end semiconductor devices.

In one embodiment, the nickel containing compound may have a formula of $R_xO_vNi_y(OR')_z$, where R and R' are H, $CH_3$, $C_2H_5$, $C_3H_7$, CO, NCO, alkyl or aryl group and x, v and z are integers having a range between 0 and 16 and y is an integer having a range between 0 and 8. In another embodiment, the nickel containing compound may have a formula of $Ni(NRR')_w$, where R and R' may be H, $CH_3$, $C_2H_5$, $C_3H_7$, CO, NCO, alkyl or aryl group and R' may be H, $CH_3$, $C_2H_5$, $C_3H_7$, CO, NCO, alkyl or aryl group and w is an integer having a range between 0 and 8. Examples of suitable nickel containing compounds are N,N'-di-tert-butylacetamidinato)$_2$Ni, $Ni(C_5H_5)_2$, $Ni[N(t\text{-uut})_2]$, $Ni(('Bu_2N)_2CCH_3)_2$, bis(cyclopentadieny)nickel, bis(ethylpentadieny)nickel, $Ni[(C_2H_5)(C_5H_4)_2]$, di(tertiarybutyl)amidonickel, and $R_xO_vNi_y(OR')_z$, $(OR)_2Ni$, wherein R may be methyl, ethyl, propyl, isopropyl, butyl, isobutyl, tertiary butyl, and other alkyl groups having higher numbers of carbon atoms, and the like. The reacting gas that may be supplied with the nickel containing gas, such as $(OR)_2Ni$, may include at least one silicon containing gas, such as silane ($SiH_4$), di-silane ($Si_2H_6$), silicon tetrafluoride ($SiF_4$), silicon tetrachloride ($SiCl_4$), and dichlorosilane ($SiH_2Cl_2$) and the like.

In some embodiments, a carrier gas, such as nitrogen ($N_2$) and nitric oxide (NO), $O_2$, $N_2O$, hydrogen ($H_2$), ammonia ($NH_3$), a mixture of hydrogen ($H_2$) and nitrogen ($N_2$) and/or inert gas, such as argon (Ar) and helium (He), may be supplied with the deposition gas mixture into the processing chamber. The addition of different reactive gases or inert gases may change the film structure and/or film chemical components, such as resistivity, thereby adjusting the deposited film to have a desired film property to meet different process requirements. In one example, the nickel containing compound is bis(cyclopentadieny)nickel or $Ni(C_5H_5)_2$ and the reacting gas is $SiH_4$.

While supplying the deposition gas mixture, an inert gas may also be supplied into the deposition gas mixture to assist the profile control as needed. Examples of the inert gas supplied in the gas mixture include Ar, He, Ne, Kr, Xe or the like.

In one embodiment, the nickel containing gas supplied in the deposition gas mixture may be maintained at a flow rate by volume between about 20 sccm and about 200 sccm. The silicon containing gas, such as $SiH_4$, is maintained at a flow rate by volume between about 10 sccm and about 100 sccm.

Several process parameters may also be controlled while supplying the deposition gas mixture to perform the deposition process. The pressure of the processing chamber may be controlled at between about 0.5 milliTorr and about 5 Torr. A substrate temperature is maintained less than 400 degrees Celsius, such as between about 15 degrees Celsius to about 400 degrees Celsius, for example between about 200 degrees Celsius and about 380 degrees Celsius. It is believed that low temperature, temperature less than 400 degrees Celsius, is desirable in fabricating nanowires for the semiconductor devices so as to minimize damages, e.g., undesired mechanical densification to the nearly low k materials or conductive material melt-down, on the fabricated device structures. The deposition process may be performed for between about 30 seconds and about 300 seconds to deposit the nickel silicide layer 308 with a thickness between about 10 Å and about 100 Å.

At operation 204, while supplying the deposition gas mixture into the processing chamber, a microwave power may be generated from the microwave generator 181 (depicted in FIG. 1A) to the gas mixture to assist dissociating the deposition gas mixture into reactive species in a plasma. The microwave power as generated energizes the deposition gas mixture within the internal volume 126 such that the plasma may be sustained. In one example, the microwave power may be operated at a frequency between 0.3 GHz and about 300 GHz. The microwave power may be applied between about 10 Watts and about 5000 Watts. In some embodiments, in addition to the microwave power as generated, one or more RF source power 147 (depicted in FIG. 1A) and/or RF bias power 184, 186 (depicted in FIGS. 1A and 1B) may also be generated during the deposition process to assist dissociating the deposition gas mixture forming the plasma. In one example, the RF source power may be supplied between about 100 Watts and about 600 Watts and at a frequency between about 250 kHz and about 13.6 MHz. A RF bias power may also be supplied as needed. The RF bias power may be supplied at between about 10 Watts and about 100 Watts. In one embodiment, the RF source power may be pulsed with a duty cycle between about 10 to about 95 percent at a RF frequency between about 500 Hz and about 10 kHz.

At operation 206, while forming the plasma from the deposition gas mixture, a light radiation may be emitted to the deposition gas mixture in the plasma so as to enhance dissociation of the gas mixtures into reactive species. The light radiation may be emitted from the light source 140 mounted on the processing chamber 100, as depicted in FIG. 1A, or from the light source 180 formed on an edge of the processing chamber 151 depicted in FIG. 1B.

It is believed that the light energy, e.g., photons, from the light sources 140, 180 may enhance generation of the IR/UV light, e.g., photons, at the substrate surface, thereby enhancing the chemical reaction occurring at the substrate surface without having to excessively increase the substrate temperature. In one embodiment, the light sources 140, 180 may emit a light energy at a wavelength between about 1 mm and about 1000 mm. The light energy may include an IR light, UV light, or combinations thereof.

At operation 208, after a desired thickness of the nickel silicide layer 308 is reached, the deposition process may then be terminated. In one example, the nickel silicide layer 308 is a nickel rich film with higher ratio of nickel elements than the ratio of the silicon elements formed in the nickel silicide layer 308. In one example, the nickel silicide layer 308 have may a ratio of Ni element to Si element substantially between about 0.8:1 and about 2:1. More nickel elements are formed on an upper/outer region of the nickel silicide layer 308, as compared to the silicon elements formed in a lower/inner region of the nickel silicide layer 308. XRD analysis indicates that the nickel silicide layer 308 as formed has strong (111), (220) and (311) plane peaks. The nickel silicide layer 308 may have a resistivity between about 8 µOhm·cm and about 25 µOhm·cm.

In some embodiment, the deposition process 200 may be performed followed by a thermal/annealing process. The deposition process may be the process 200 described above or any suitable deposition techniques, such as plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD) and the like, followed by a thermal/annealing process. After the nickel silicide layer 308 is formed on the substrate 300, a low temperature, such as less than 400 degrees Celsius, thermal/annealing process may be performed on the nickel silicide layer 308 in a thermal processing chamber, such as a RTP chamber or any suitable heating processing chamber, capable of performing a microwave assisted thermal/annealing process. The thermal processing chamber may be similarly configured as the processing chamber described in FIGS. 1A and 1B, with a heating module, such as a lamp or heating assembly formed therein with a microwave generator coupled thereto. The microwave power applied during thermal/annealing process may gently heat/thermal process the nickel silicide layer 308 without adversely destroy or damage the film structures of the nickel silicide layer 308. The microwave power may be regulated similar to the microwave power described at operation 204 described in process 200 with reference to FIG. 2. In one example, the microwave power may be operated at a frequency between 0.3 GHz and about 300 GHz. The microwave power may be applied between about 10 Watts and about 5000 Watts. While performing the thermal/annealing process, a carrier gas may be supplied during the heat/thermal process. The carrier gas may be selected from a group consisting of $N_2$, $O_2$, $H_2$, inert gas, or any suitable gases as needed.

Similar to the operation 206, while performing the thermal/annealing process with the microwave power, a light radiation may be emitted to the metal silicide layer 208 so as to enhance reconstruction of the film structures of the metal silicide layer 208. It is believed that the light energy, e.g., photons, may enhance generation of the IR/UV light, e.g., photons, at the substrate surface, thereby enhancing the film structure rearrangement or reconstruction to the nickel silicide layer 208. In one embodiment, the light radiation may have a wavelength between about 1 mm and about 1000 mm. The light radiation may include an IR light, UV light, or combinations thereof.

The thermal/annealing process followed by the deposition process is performed to repair, densify and enhance lattice structures of the nickel silicide layer 308. For example, after the thermal/annealing process, the nickel silicide layer 308 may have stronger crystalline structures of (111), (220) and (311) plane peaks under XRD analysis, as compared to the nickel silicide layer 308 prior to, e.g., without, the thermal/annealing process.

Figure 4A:
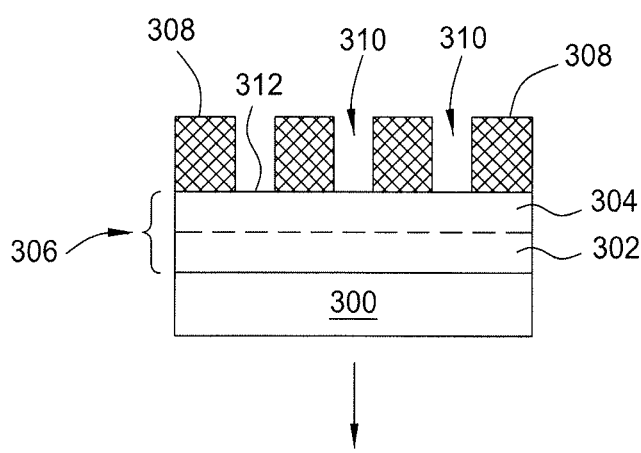
FIG. 4A-4B depict a manufacturing sequence regarding how the metal silicide layer formed in FIG. 2 may be utilized in a semiconductor back-end interconnection structure.
Figure 4B:
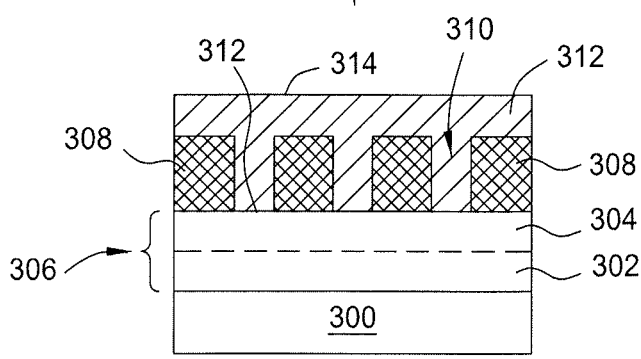
Figure 5A:
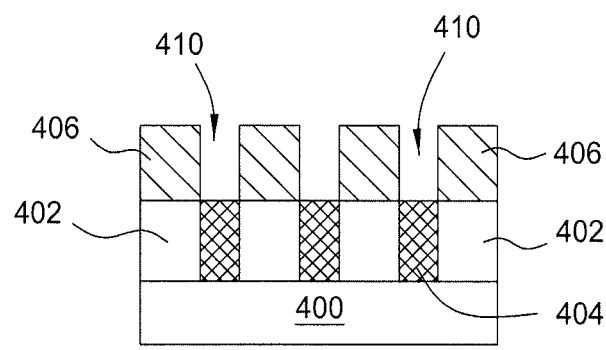
FIG. 5A-5B depict another manufacturing sequence regarding how the metal silicide layer formed in FIG. 2 may be utilized in a semiconductor back-end interconnection structure.
Figure 5B:
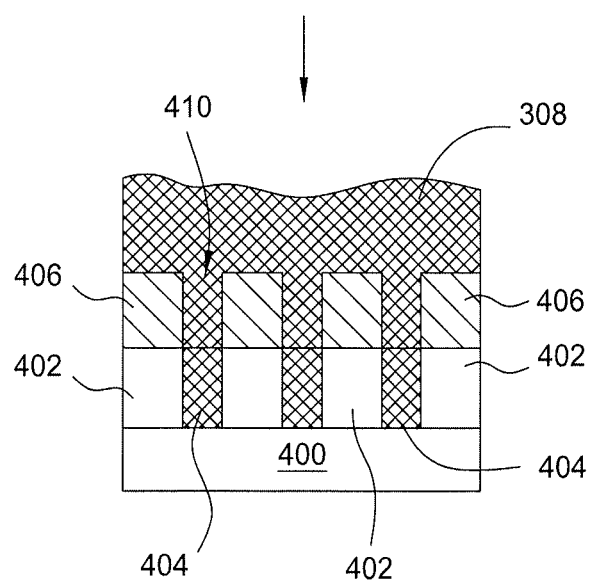

The nickel silicide layer 308 formed on the substrate 300 may be a blanket film that may be utilized to form conductive nanowires. For example, the nickel silicide layer 308 may be later patterned or etched to form openings 310 in the nickel silicide layer 308, as shown in FIG. 4A. Subsequently, a low-k dielectric material 312 may then be filled in the openings 310 to form a planar surface 314 for forming an interconnection structure, such as a back-end interconnection structure, on the substrate 300. In another example, the process 200 may be performed on a substrate 400 having a first low-k dielectric layer 406 disposed on a second low-k dielectric layer 402, as shown in FIG. 5A. An underlying conductive wire 410 may be formed in the second low-k dielectric layer 402. The first low-k dielectric layer 406 may have openings 410 formed therein. When the process 200 is performed on the substrate 400, the nickel silicide layer 308 may then fill into the openings 410 defined in the first low-k material layer 406 to form nanowires in the first low-k material layer 406, as shown in FIG. 5B, forming a back-end interconnection structure for semiconductor devices.

Thus, methods and an apparatus for forming a metal silicide layer at low temperature are provided. The method and apparatus advantageously forming a metal silicide layer at a temperature less than 400 degrees Celsius utilizing a plasma enhanced chemical vapor deposition or other suitable deposition techniques. The metal silicide layer formed under low temperature may be utilized to form conductive nanowire for next generation semiconductor devices.

While the foregoing is directed to embodiments of the present invention, other and further embodiments of the invention can be devised without departing from the basic scope thereof, and the scope thereof is determined by the claims that follow.

The invention claimed is:

1. An apparatus for forming metal silicide nanowires for a back-end interconnection structure comprising:
   a chamber body having a chamber lid disposed on a chamber sidewall defining an interior volume of a plasma processing chamber;
   a gas panel configured to provide a metal containing gas comprising a nickel containing compound into the interior volume of the plasma processing chamber;
   a substrate support pedestal disposed in the interior volume of the plasma processing chamber;
   a microwave generator coupled to the chamber body; and
   a light source disposed in the plasma processing chamber.

2. The apparatus of claim 1, wherein the light source provides IR or UV light to the interior volume of the plasma processing chamber during a plasma process.

3. The apparatus of claim 1, wherein the light source is configured to provide a light radiation to a substrate disposed on the substrate support pedestal.

4. The apparatus of claim 3, wherein the light radiation has a light wavelength between about 1 mm and about 1000 mm.

5. The apparatus of claim 4, wherein the light radiation has a light wavelength between about 110 mm and about 600 mm.

6. The apparatus of claim 1, further comprising:
   a RF bias source coupled to the substrate support pedestal.

7. The apparatus of claim 1, wherein the microwave generator is configured to generate a microwave power having a frequency between 0.3 GHz and about 300 GHz.

8. The apparatus of claim 1, further comprising:
   a remote plasma source coupled to the gas panel.

9. The apparatus of claim 1, wherein the nickel containing compound is bis(cyclopentadieny)nickel or $Ni(C_5H_5)_2$.

* * * * *